US009673291B2

(12) United States Patent
Fukuzumi

(10) Patent No.: US 9,673,291 B2
(45) Date of Patent: Jun. 6, 2017

(54) SEMICONDUCTOR MEMORY DEVICE AND METHOD FOR MANUFACTURING SAME

(71) Applicant: KABUSHIKI KAISHA TOSHIBA, Minato-ku (JP)

(72) Inventor: Yoshiaki Fukuzumi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/184,735

(22) Filed: Jun. 16, 2016

(65) Prior Publication Data

US 2016/0300846 A1    Oct. 13, 2016

Related U.S. Application Data

(63) Continuation of application No. 14/833,450, filed on Aug. 24, 2015, now Pat. No. 9,397,109.

(60) Provisional application No. 62/132,906, filed on Mar. 13, 2015.

(51) Int. Cl.
  *H01L 29/45* (2006.01)
  *H01L 27/1157* (2017.01)
  *H01L 27/11582* (2017.01)

(52) U.S. Cl.
  CPC ........ *H01L 29/456* (2013.01); *H01L 27/1157* (2013.01); *H01L 27/11582* (2013.01)

(58) Field of Classification Search
  CPC ......... H01L 27/11582; H01L 27/11578; H01L 29/792; H01L 27/11556; H01L 29/66833; H01L 27/11551; H01L 27/115; H01L 27/11529; H01L 27/11548; H01L 27/11568; H01L 21/8229; H01L 27/1052
  See application file for complete search history.

(56) References Cited

U.S. PATENT DOCUMENTS

| 7,936,004 | B2 | 5/2011 | Kito et al. |
| 7,983,261 | B1 | 7/2011 | Aggarwal et al. |
| 7,994,011 | B2 | 8/2011 | Park |
| 8,372,720 | B2 | 2/2013 | Fukuzumi et al. |
| 8,513,731 | B2 * | 8/2013 | Lee ............... H01L 27/0688 257/329 |
| 8,551,838 | B2 | 10/2013 | Kito et al. |
| 8,729,624 | B2 | 5/2014 | Fukuzumi et al. |

(Continued)

FOREIGN PATENT DOCUMENTS

JP    2002-083867    3/2002

Primary Examiner — Karen Kusumakar
(74) Attorney, Agent, or Firm — Oblon, McClelland, Maier & Neustadt, L.L.P.

(57) ABSTRACT

According to one embodiment, a semiconductor memory device includes a substrate; a stacked body provided on the substrate and including a first stacked portion, a second stacked portion and an intermediate layer, the first stacked portion and the second stacked portion including a plurality of electrode layers and a plurality of insulating layers, the intermediate layer provided between the first stacked portion and the second stacked portion; a column including a semiconductor film and a charge storage film; and an insulating part provided in the stacked body. The column has a first enlarged portion. The insulating part has a second enlarged portion surrounded by the intermediate layer, the second enlarged portion has a larger width than a width of the portion of the insulating part in the first stacked portion and the second stacked portion.

20 Claims, 9 Drawing Sheets

(56) References Cited

U.S. PATENT DOCUMENTS

| | | |
|---|---|---|
| 9,035,374 B2 | 5/2015 | Fukuzumi et al. |
| 9,064,735 B2 | 6/2015 | Kito et al. |
| 2006/0186446 A1* | 8/2006 | Kim .................. H01L 27/115 257/296 |
| 2015/0200204 A1 | 7/2015 | Fukuzumi et al. |

* cited by examiner

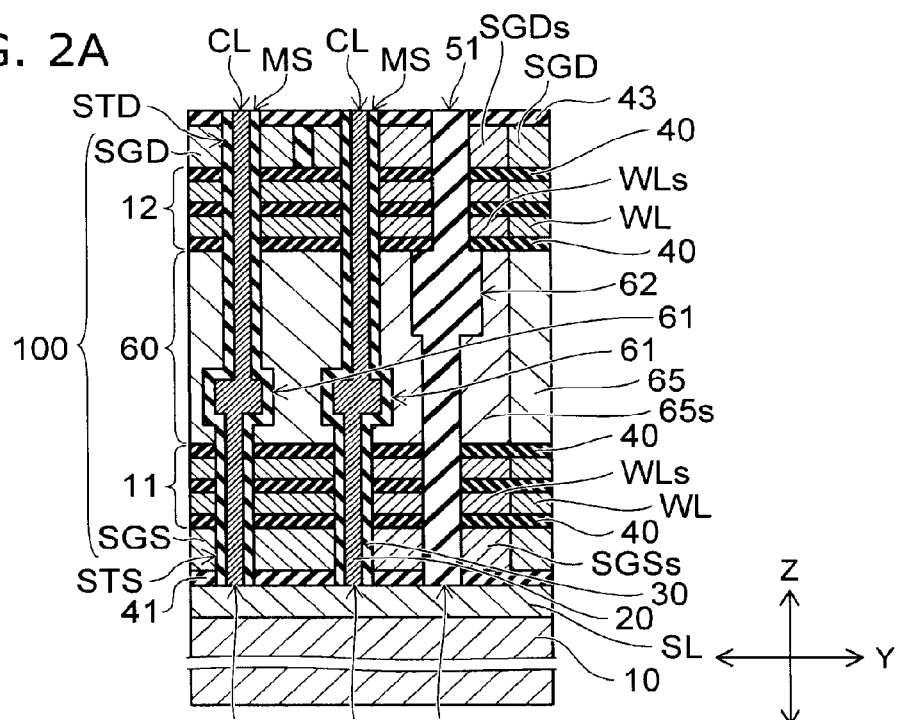
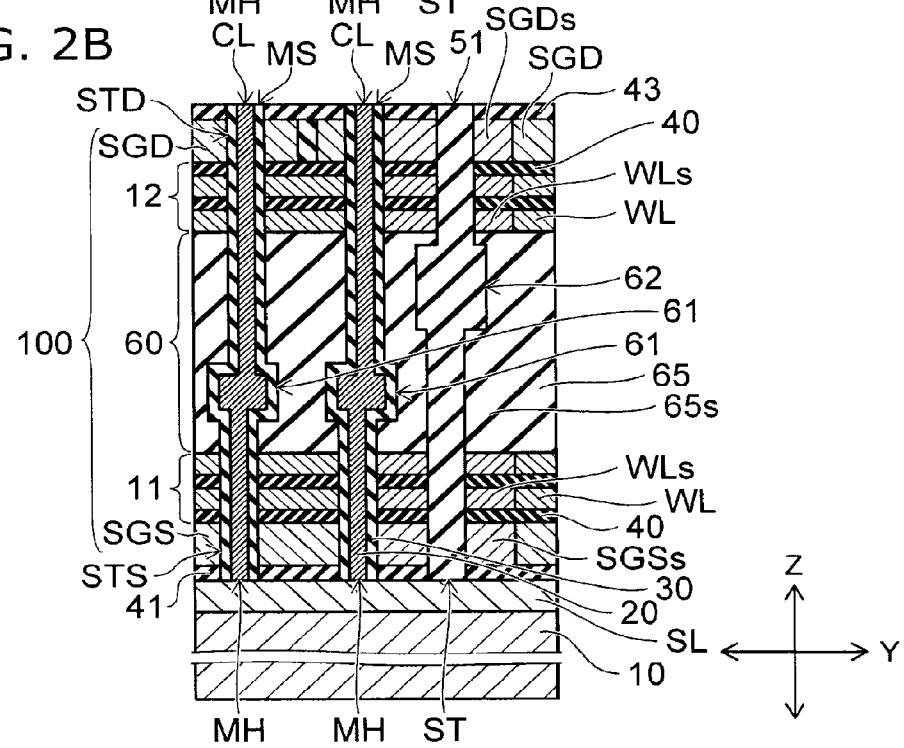

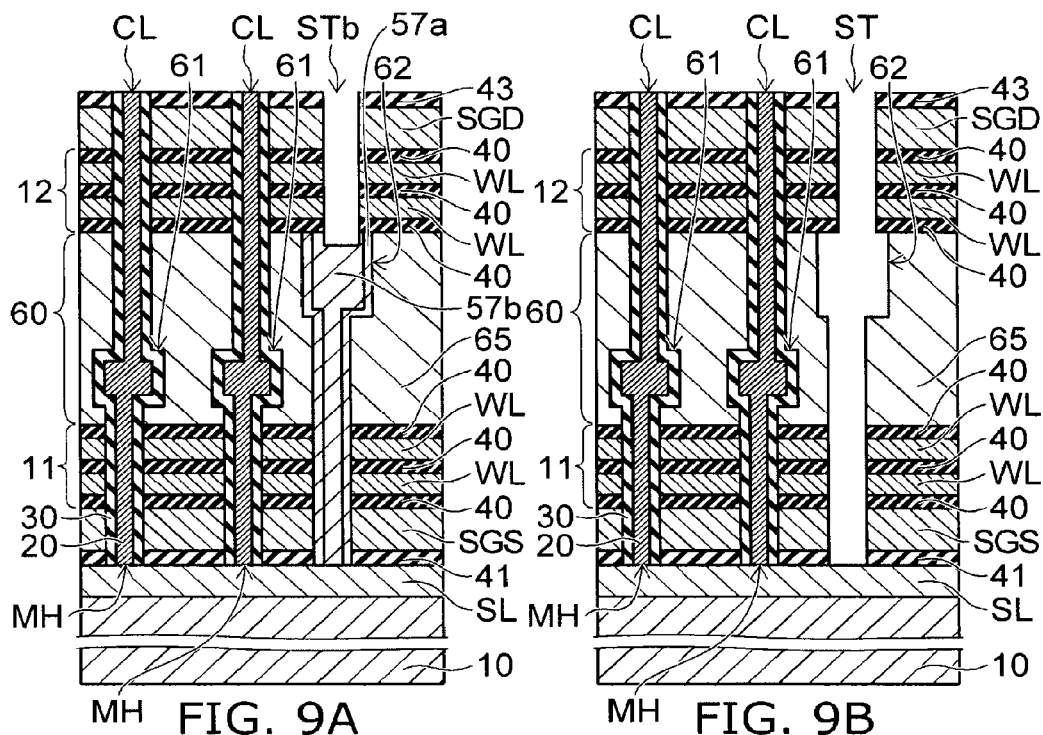
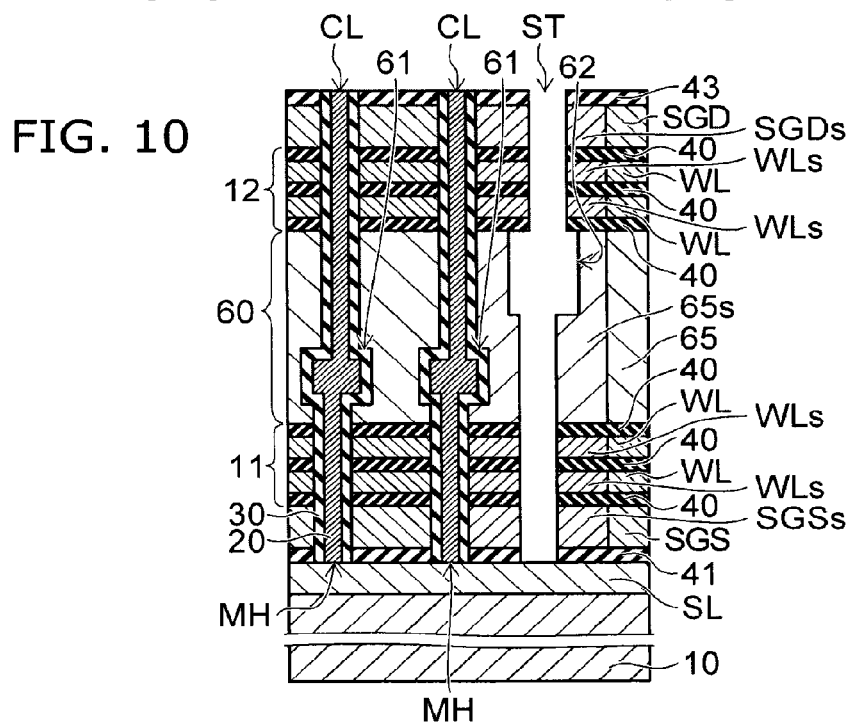

SEMICONDUCTOR MEMORY DEVICE AND METHOD FOR MANUFACTURING SAME

This application is a continuation of U.S. patent application Ser. No. 14/833,450 filed on Aug. 24, 2015, which is based upon and claims the benefit of priority from U.S. Provisional Patent Application No. 62/132,906 filed on Mar. 13, 2015; the entire contents of each of which are incorporated herein by reference.

FIELD

Embodiments described herein relate generally to a semiconductor memory device and a method for manufacturing same.

BACKGROUND

A memory device having a three-dimensional structure has been proposed in which a memory hole is formed in a stacked body in which electrode layers are stacked with insulating layers interposed therebetween, the electrode layers functioning as a control gate in a memory cell, and in which a silicon body is provided in a side wall of the memory hole, the silicon body becoming a channel with a charge storage film interposed therebetween.

With respect to the stacked body, including the plurality of electrode layers and the plurality of insulating layers, provided in this type of three-dimensional device, a memory hole or a slit is formed using a reactive ion etching (RIE) method, for example. At this time, as a number of layers in the stacked body increases, higher shape controllability and dimensional controllability are required for the etching operation.

BRIEF DESCRIPTION OF THE DRAWINGS

FIGS. 2A and 2B are schematic cross-sectional views of the memory strings of the embodiment;

FIG. 4A to FIG. 10 are schematic cross-sectional views showing a method for manufacturing the semiconductor memory device of the embodiment.

DETAILED DESCRIPTION

Figure 1:
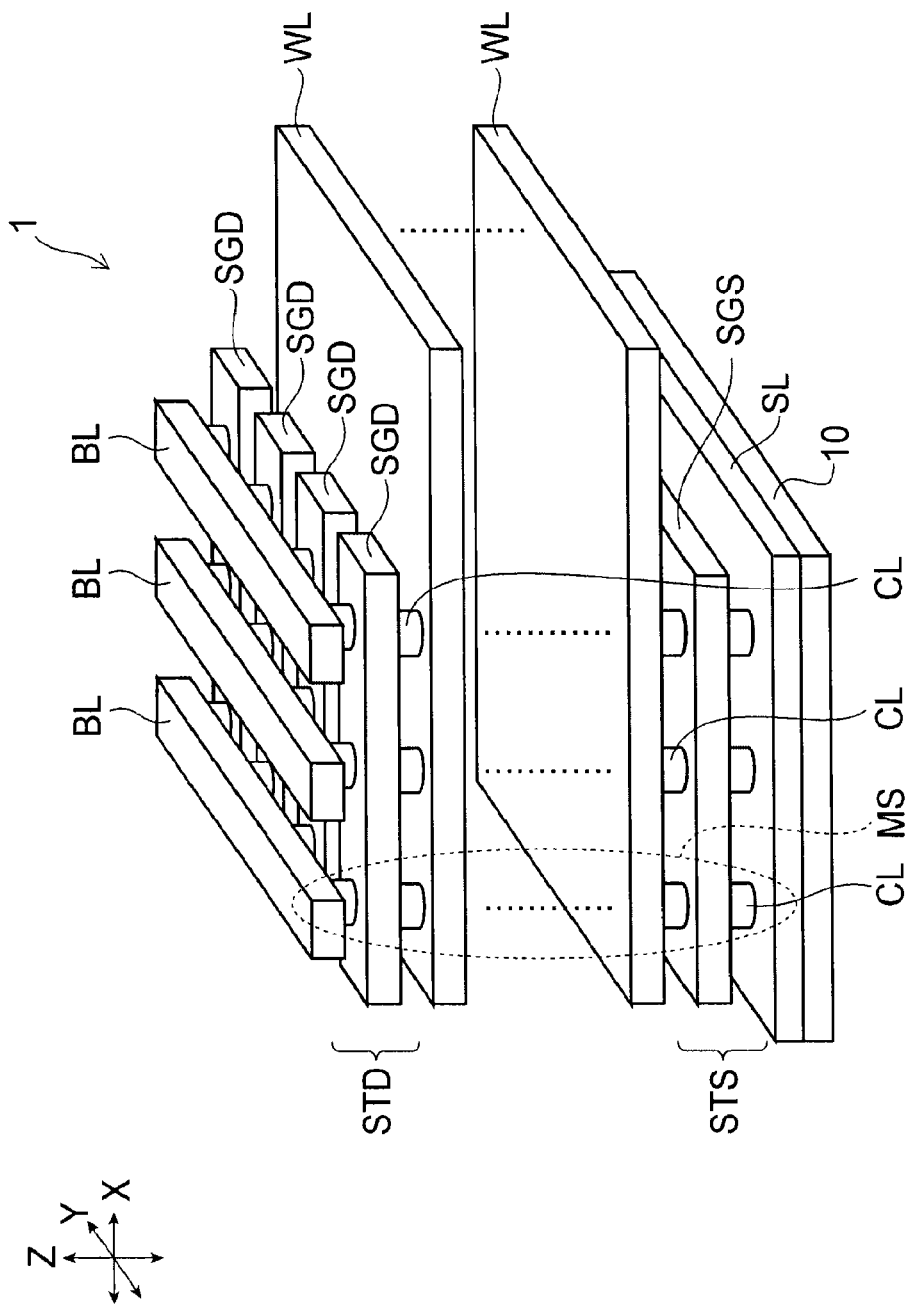
FIG. 1 is a schematic perspective view of a memory cell array of an embodiment.

According to one embodiment, a semiconductor memory device includes a substrate; a stacked body provided on the substrate and including a first stacked portion, a second stacked portion and an intermediate layer, the first stacked portion and the second stacked portion including a plurality of electrode layers and a plurality of insulating layers, the electrode layers separately stacked each other, the insulating layers provided between the electrode layers, the intermediate layer provided between the first stacked portion and the second stacked portion; a column including a semiconductor film and a charge storage film, the semiconductor film provided in the stacked body and extending in a stacking direction of the stacked body, the charge storage film provided between the semiconductor film and the electrode layers; and an insulating part provided in the stacked body and extending in the stacking direction. The column has a first enlarged portion surrounded by the intermediate layer, the first enlarged portion has a larger diameter than a diameter of a portion of the column in the first stacked portion and the second stacked portion. The insulating part has a second enlarged portion surrounded by the intermediate layer, the second enlarged portion has a larger width than a width of the portion of the insulating part in the first stacked portion and the second stacked portion.

Embodiments will be described below with reference to drawings. Note that the same reference numerals are applied to the same elements in each drawing.

FIG. 1 is a schematic perspective view of a memory cell array 1 of an embodiment. In FIG. 1, the insulating layers between the electrode layers, and the like are omitted for ease of understanding of the drawing.

In FIG. 1, two mutually orthogonal directions are defined as an X-direction and a Y-direction, and a direction orthogonal to both the X-direction and the Y-direction (an XY plane), in which a plurality of electrode layers WL is stacked, is defined as a Z-direction (a stacking direction).

The memory cell array 1 has a plurality of memory strings MS.

FIGS. 2A and 2B are schematic cross-sectional views of a single memory string MS. FIGS. 2A and 2B illustrate a cross-section parallel to a YZ plane in FIG. 1. In FIGS. 2A and 2B, a structure above a drain-side select gate SGD illustrated in FIG. 1 is omitted.

In the memory cell array 1, a source layer SL (a source line) is provided on a substrate 10. On the source layer SL, a source-side select gate SGS (a lower select gate or a lower gate layer) is provided with an insulating layer 41 interposed therebetween. On the source-side select gate SGS, a stacked body 100 is provided that is stacked with insulating layers 40 interposed therebetween.

The stacked body 100 has a plurality of stacked portions. Although two stacked portions (a first stacked portion 11 and a second stacked portion 12) are illustrated in FIGS. 2A and 2B, the number of stacked portions may be three or more.

Further, the stacked body 100 has an intermediate layer 60 provided between the stacked portions (the first stacked portion 11 and the second stacked portion 12). The intermediate layer 60 is provided between the stacked portions. For example, when n of stacked portions are provided, n−1 of intermediate layers are provided as a whole so that the intermediate layer is provided between each of the stacked portions.

The first stacked portion 11 (lower stacked body) has the plurality of electrode layers WL and the plurality of insulating layers 40. The electrode layers WL and the insulating layers 40 are, for example, stacked alternately one by one. The electrode layers WL is separately stacked each other. The insulating layer 40 is provided between the electrode layers WL.

The first stacked portion 11 is provided on the source-side select gate SGS. The insulating layer 40 is provided between the source-side select gate SGS and the bottommost electrode layer WL of the first stacked portion 11.

Similarly to the first stacked portion 11, the second stacked portion 12 (upper stacked body) has the plurality of electrode layers WL and the plurality of insulating layers 40. In the second stacked portion 12, the electrode layers WL and the insulating layers 40 are also stacked alternately one by one, thereby forming a plurality of layers. The insulating layer 40 is provided between the electrode layers WL.

The numbers of layers provided in the first stacked portion 11 and the second stacked portion 12 illustrated in the drawings are only examples, and the numbers of the electrode layers WL may be any chosen numbers.

The second stacked portion 12 is provided on the first stacked portion 11 with the intermediate layer 60 interposed therebetween. As illustrated in FIG. 2A, the intermediate layer 60 is provided between the uppermost insulating layer 40 of the first stacked portion 11 and the bottommost insulating layer 40 of the second stacked portion 12.

The electrode layer WL, the drain-side select gate SGD, and the source-side select gate SGS are silicon layers including silicon as a major component, for example. Further, the electrode layer WL, the drain-side select gate SGD, and the source-side select gate SGS include impurities in order to impart electrical conductivity to the silicon layers, and may include metal silicide.

The drain-side select gate SGD and the source-side select gate SGS are thicker than a single layer of the electrode layer WL, respectively.

The insulating layers 40 and 41 are silicon oxide layers including silicon oxide as a major component, for example.

The intermediate layer 60 has a dummy layer 65 (first film). The same material as that of the electrode layer WL is used as the dummy layer 65. For example, the dummy layer 65 includes a conductive film. As illustrated in FIG. 2B, the same material as that of the insulating layer 40 may be used as the dummy layer 65, for example. For example, the dummy layer 65 includes an insulating film. In FIG. 2B, the intermediate layer 60 is provided between the uppermost electrode layer WL of the first stacked portion 11 and the bottommost electrode layer WL of the second stacked portion 12.

A thickness of the intermediate layer 60 is thicker than that of a single layer of the electrode layer WL. The thickness of the intermediate layer 60 is not less than three times thicker than that of a single layer of the electrode layer WL, for example.

Columns CL extending in the Z-direction are provided in the stacked body 100. Each of the columns CL penetrates through the stacked body 100. The column CL is formed as a cylindrical pillar or an elliptical pillar shape, for example.

An insulating separation part 51 (insulating part) extending in the Z-direction is provided in the stacked body 100. The insulating separation part 51 pierces the stacked body 100. The insulating separation part 51 extends in the X-direction (a direction that penetrates through the paper in FIGS. 2A and 2B) and separates the stacked body 100 into a plurality of sections in the Y-direction. The insulating separation part 51 may have a interconnect part extending in the Z-direction.

Figure 3:
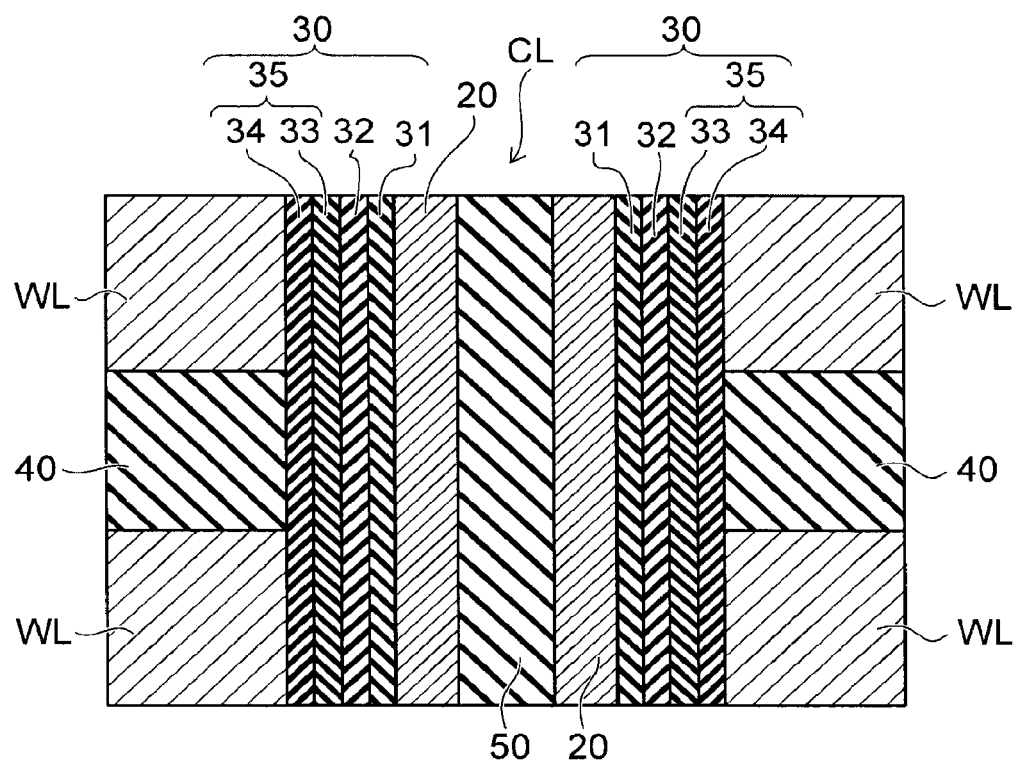
FIG. 3 is an enlarged schematic cross-sectional view of a part of the column of the embodiment.

FIG. 3 is an enlarged schematic cross-sectional view of a portion of the column CL.

Figures 8A, 8B:
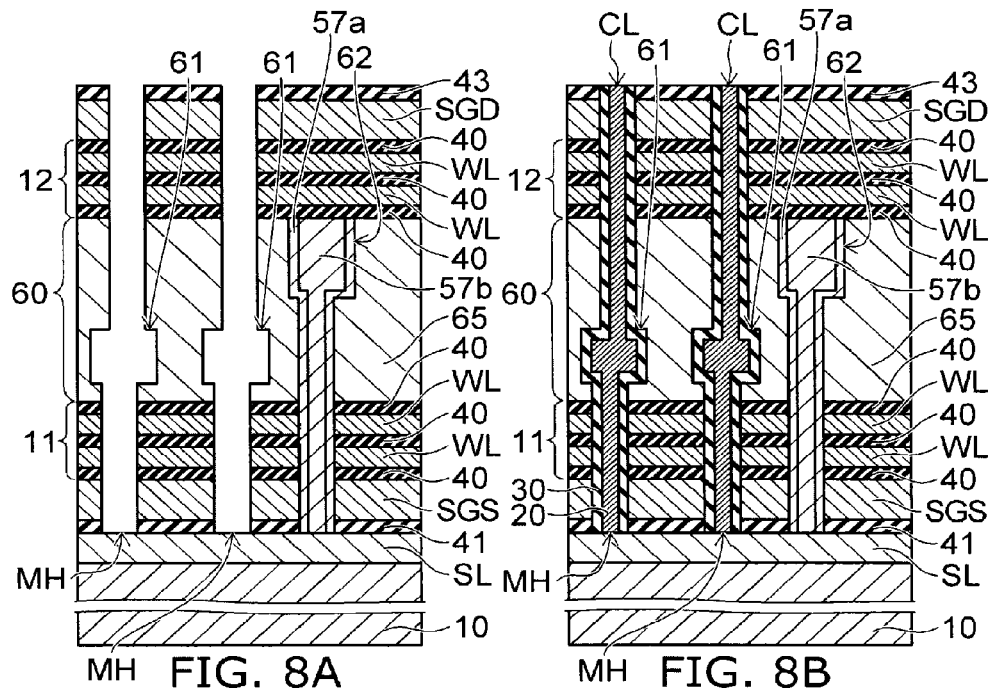

The column CL is provided in the stacked body 100 and in contact with the source layer SL. The column CL is provided in a straight (I-shaped) memory hole MH (FIG. 8A). For example, the memory hole MH includes a first memory hole portion, a second memory hole portion and a connecting portion. The first memory hole portion is provided in the second stacked portion 12. The second memory hole portion is provided in the first stacked portion 11. The connecting portion is integrally connected to the first memory hole portion and the second memory hole portion. The connecting portion is provided in contact with the dummy layer 65. For example, the dummy layer 65 is in contact with an upper surface of the connecting portion, a side surface of the connecting portion and a lower surface of the connecting portion. For example, the dummy layer 65 integrally covers the upper surface of the connecting portion, the side surface of the connecting portion and the lower surface of the connecting portion, and as viewed in the Y-direction (first direction) parallel to the major surface of the substrate 10, the dummy layer 65 overlaps the connecting portion. In the Y-direction, a length of the connecting portion is longer than a length of the first memory hole portion and longer than a length of the second memory hole portion.

A channel body 20 (semiconductor film, a silicon cannel layer) is provided in the memory hole MH as a semiconductor channel. The channel body 20 is a silicon film, for example. The impurity concentration of the channel body 20 is lower than the impurity concentration of the electrode layer WL. An upper side of the channel body 20 is electrically connected to a bit line BL, and a lower side of the channel body 20 is electrically connected to source layer SL. The bit line BL extends Y-direction A memory film 30 is provided between an inner wall of the memory hole MH and the channel body 20. The memory film 30 is provided between the electrode layers WL and the channel body 20. The memory film 30 has a block insulating film 35, a charge storage film 32, and a tunnel insulating film 31.

The block insulating film 35, the charge storage film 32, and the tunnel insulating film 31 are provided between the electrode layer WL and the channel body 20 in this order from the electrode layer WL side.

The channel body 20 is provided extending in a tubular shape in the stacking direction of the stacked body 100, and the memory film 30 is provided surrounding an outer peripheral surface of the channel body 20 and extending in a tubular shape in the stacking direction of the stacked body 100.

The electrode layer WL surrounds the periphery of the channel body 20 with the memory film 30 interposed therebetween. Also, a core insulating film 50 is provided on an inner side of the channel body 20. The core insulating film 50 is a silicon oxide film, for example.

The block insulating film 35 is in contact with the electrode layer WL. The tunnel insulating film 31 is in contact with the channel body 20. The charge storage film 32 is provided between the block insulating film 35 and the tunnel insulating film 31.

The channel body 20 functions as a channel in a memory cell, and the electrode layer WL functions as a control gate of the memory cell. The charge storage film 32 functions as a data memory layer that stores an electric charge infused from the channel body 20. In other words, the memory cell is formed having a structure in which a control gate encompasses the channel periphery at the location where the channel body 20 and each of the electrode layers WL intersect.

The semiconductor memory device of the embodiment is a non-volatile semiconductor memory device that can freely erase and write data electrically, and can retain the contents of the memory even when the power supply is turned off.

The memory cell is a charge trap type of memory cell, for example. The charge storage film 32 has a great number of trap sites that trap the charge. The charge storage film 32 is a silicon nitride film, for example.

The tunnel insulating film 31 functions as a potential barrier when an electric charge is infused from the channel body 20 into the charge storage film 32 or when the electric charge stored in the charge storage film 32 is diffused to the channel body 20. The tunnel insulating film 31 is a silicon oxide film, for example.

Alternatively, a stacked film (an ONO film) having a structure in which a silicon nitride film is sandwiched by a pair of silicon oxide films may be used as the tunnel insulating film. When the ONO film is used as the tunnel insulating film, an erasing operation can be performed in a low electric field, compared with a case in which a single layer of a silicon oxide film is used.

The block insulating film 35 inhibits the electric charge stored in the charge storage film 32 from being diffused to the electrode layer WL. The block insulating film 35 has a cap film 34 provided so as to be in contact with the electrode layer WL and a block film 33 provided between the cap film 34 and the charge storage film 32.

The block film 33 is a silicon oxide film, for example. The cap film 34 is a film that has a higher dielectric constant than that of silicon oxide and is a silicon nitride film, for example. By providing this type of cap film 34 while causing the cap film 34 to be in contact with the electrode layer WL, it is possible to suppress back tunneling electrons that are infused from the electrode layer WL at the time of erasing. By using the stacked film, which is formed by the silicon oxide films and the silicon nitride film, as the block insulating film 35, it is possible to improve an electric charge blocking performance.

As illustrated in FIGS. 1, 2A, and 2B, a drain-side select transistor STD is provided on an upper end portion of the column CL in the straight-shaped memory string MS, and a source-side select transistor STS is provided on a lower end portion of the column CL.

The memory cell, the drain-side select transistor STD, and the source-side select transistor STS are vertical transistors in which the electric current flows in the stacking direction (Z-direction) of the stacked body.

The drain-side select gate SGD functions as a gate electrode (a control gate) for the drain-side select transistor STD. An insulating film that functions as a gate insulating film for the drain-side select transistor STD is provided between the drain-side select gate SGD and the channel body 20.

The source-side select gate SGS functions as a gate electrode (a control gate) of the source-side select transistor STS. An insulating film that functions as a gate insulating film for the source-side select transistor STS is provided between the source-side select gate SGS and the channel body 20.

A plurality of memory cells, in which the electrode layer WL of each layer functions as the control gate, is provided between the drain-side select transistor STD and the source-side select transistor STS.

The plurality of memory cells, the drain-side select transistor STD, and the source-side select transistor STS are serially connected through the channel body 20 and configure a single straight memory string MS. As a result of a plurality of such memory strings MS being arranged in the X-direction and the Y-direction, the plurality of memory cells is three-dimensionally arranged in the X-direction, Y-direction, and Z-direction.

As illustrated in FIG. 2A, the column CL has a first enlarged portion 61. The first enlarged portion 61 is provided in the intermediate layer 60 of the column CL.

The first enlarged portion 61 is surrounded by the intermediate layer 60. The first enlarged portion 61 has a shape that is formed by causing a side surface of the column CL to protrude into the intermediate layer 60. A diameter of the first enlarged portion 61 is larger than diameters of portions of the column CL in the first stacked portion 11 and the second stacked portion 12 respectively.

The insulating separation part 51 has a second enlarged portion 62. The second enlarged portion 62 is provided in the intermediate layer 60 of the insulating separation part 51.

The second enlarged portion 62 is surrounded by the intermediate layer 60. The second enlarged portion 62 has a shape that is formed by causing a side surface of the insulating separation part 51 to protrude into the intermediate layer 60. A width (a width in the Y-direction) of the second enlarged portion 62 is larger than widths (widths in the Y-direction) of the portions of the column CL in the first stacked portion 11 and the second stacked portion 12 respectively.

A central position of the first enlarged portion 61 in the stacking direction is out of alignment with a central position of the second enlarged portion 62 in the stacking direction. The central position of the first enlarged portion 61 in the stacking direction is provided further to the first stacked portion 11 side than the central position of the second enlarged portion 62 in the stacking direction, for example.

A side surface of the first enlarged portion 61 and a side surface of the second enlarged portion 62 do not overlap in the stacking direction. The side surface of the first enlarged portion 61 and the side surface of the second enlarged portion 62 do not face each other in the Y-direction.

An upper surface of the second enlarged portion 62 is in contact with the bottommost insulating layer 40 of the second stacked portion 12.

A position of the first enlarged portion 61 in the stacking direction may be provided further to the second stacked portion side than a position of the second enlarged portion 62 in the stacking direction, for example.

A side surface of the insulating separation part 51 is in contact with side surfaces of the source-side select gate SGS, the electrode layer WL, a dummy part (also referred to as a dummy layer in other sections) 65, and the drain-side select gate SGD, and metal silicide parts (SGSs, WLs, 65s, and SGDs) are provided on those side surfaces.

The intermediate layer 60 has electrical conductivity, for example. Similarly to the electrode layer WL, the intermediate layer 60 also surrounds the periphery of the channel body 20 with the memory film 30 interposed therebetween. However, data is not written to the charge storage film 32 that faces the intermediate layer 60, and cells in a layer, in which the intermediate layer 60 is provided, do not function as memory cells performing data storage and retention.

When data is written to the memory cell, a writing potential Vprog (around 20 V, for example) is supplied to the electrode layer WL of the memory cell to which the data is written. A pass potential (or an intermediate potential) Vpass (around 10 V, for example) is supplied to the electrode layer WL of the memory cell to which the data is not written, the pass potential Vpass is lower than the Vprog. As a result, the electric field intensity applied to the charge storage film 32 becomes strong only in the memory cell to which the data is written.

At the time of the data being written, the same Vpass as the one supplied to the memory cell to which the data is not written is supplied to the intermediate layer 60, and the data is not written to the charge storage film 32 facing the intermediate layer 60.

At the time of the data being read, a potential Vread that is supplied to the electrode layer WL of the memory cell from which the data is not read is supplied to the intermediate layer 60, or a potential that causes the electric current to pass through the channel body 20 facing the intermediate layer 60 is supplied to the intermediate layer 60.

When the memory hole MH and a slit ST are formed respectively in the first stacked portion 11 and the second stacked portion 12, there may be a case in which an opening (a hole, a slit) pattern of a resist mask is misaligned, for example. As a result, a central axis of a hole formed in the first stacked portion 11 and a central axis of a hole formed in the second stacked portion 12 may not match up with each other, and there may be a case in which the central axes are misaligned with each other in the Y-direction or the X-direction.

According to this embodiment, the enlarged portions (the first enlarged portion 61 and the second enlarged portion 62) are provided in the intermediate layer 60. As a result, even when the central axis of the hole formed in the second stacked portion 12 is out of alignment with the central axis of the hole formed in the first stacked portion 11, etching is reliably stopped in the enlarged portion, and a memory hole MHb illustrated in FIG. 7B does not reach the first stacked portion 11. By this, it is possible to suppress yield from being reduced. Specifically, there may be a case in which the central axis of the hole (the column) formed in the second stacked portion 12 does not overlap with the central axis of the hole (the column) formed in the first stacked portion 11. Thus, the central axis of the column CL provided on the first enlarged portion 61 may be displaced with respect to the central axis of the column CL provided below the first enlarged portion 61. The central position in a width direction of the insulating separation part 51 provided on the second enlarged portion 62 may be displaced with respect to the central position in the width direction of the insulating separation part 51 provided below the second enlarged portion 62.

Thus, according to this embodiment, it is possible to form the hole (the memory hole MH, the slit ST, and the like) in the stacked body in a divided manner using not less than two stages without enlarging the size of the memory cell.

Next, a manufacturing method of a semiconductor memory device of the embodiment will be described with reference to FIGS. 4A to 10.

Figures 4A, 4B:
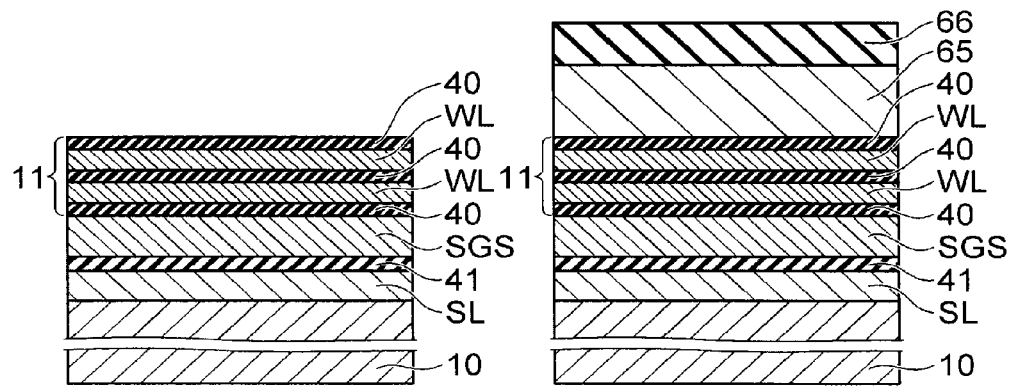

As illustrated in FIG. 4A, the source layer SL is formed on the substrate 10. On the source layer SL, the source-side select gate SGS is formed with the insulating layer 41 interposed therebetween. The first stacked portion 11 is formed on the source-side select gate SGS, the first stacked portion 11 includes the electrode layers WL and the insulating layers 40, the electrode layers WL are separately stacked each other, and the insulating layers 40 are formed between the electrode layers WL. The insulating layers 40 and the electrode layers WL are, for example, alternately stacked on one another.

As illustrated in FIG. 4B, the dummy layer 65 is formed on the first stacked portion 11. A silicon to which impurities are added is used as the dummy layer 65, for example. A thickness of the dummy layer 65 is 100 nanometers (nm), for example.

After that, a cover layer 66 is formed on the dummy layer 65. Boron silicate glass (BSG) is used as the cover layer 66, for example.

Figures 4C, 4D:
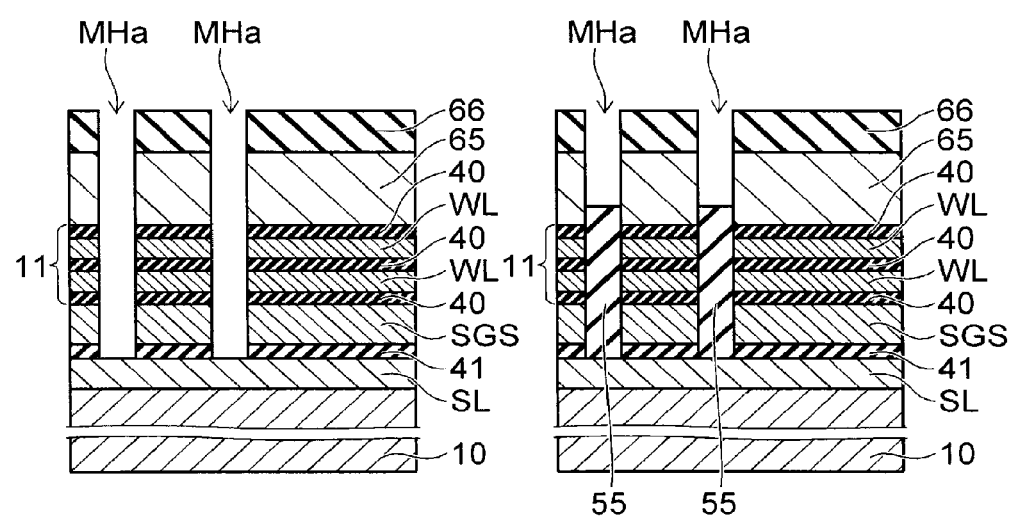

As illustrated in FIG. 4C, memory holes MHa (first holes, first memory hole) are formed. The memory hole MHa is formed by the reactive ion etching (RIE) method that uses a mask that is not illustrated in the drawings, for example.

The memory hole MHa pierces a portion from the cover layer 66 to the insulating layer 41 and reaches the source layer SL.

As illustrated in FIG. 4D, a resist film 55 is formed in the memory hole MHa. The resist film 55 is embedded from a lower end portion of the memory hole MHa up to a certain height in the dummy layer 65. After the resist film 55 is formed in the memory hole MHa and on the cover layer 66, the resist film 55 is etched back, for example, and retreats to a certain height in the dummy layer 65.

Next, etching is isotropically performed, through the memory hole MHa, of a side surface of the dummy layer 65 formed above an upper surface of the resist film 55. A chemical dry etching (CDE) method is used as a method to remove the dummy layer 65, for example.

After that, etching is isotropically performed of the side surface of the cover layer 66 through the memory hole MHa. Isotropic etching using buffered hydrogen fluoride (BHF) is used as a method to remove the cover layer 66, for example. By this, a side surface of the cover layer 66 is formed in the same plane as the side surface of the dummy layer 65.

Figure 5A:
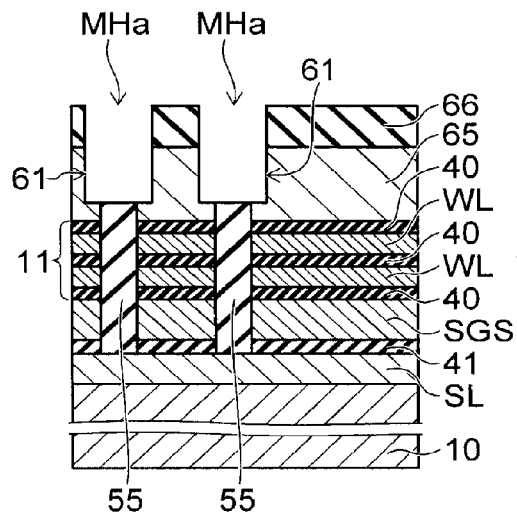

As a result, as illustrated in FIG. 5A, the first enlarged portion 61 is formed in the memory hole MHa. A diameter of the first enlarged portion 61 is larger than a diameter of the memory hole MHa that is formed below the first enlarged portion 61. The first enlarged portion 61 is surrounded respectively by the dummy layer 65 and the cover layer 66. After that, the resist film 55 that remains in the memory hole MHa is removed.

Figure 5B:
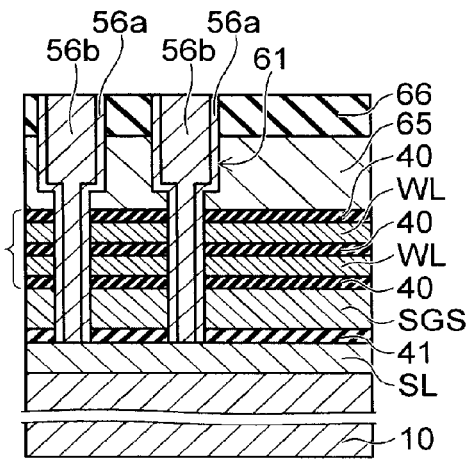

After the resist film 55 is removed, as illustrated in FIG. 5B, a sacrificial film 56a (a first film) is formed on an inner wall of the memory hole MHa, and a sacrificial film 56b (a second film) is formed on an inner side of the sacrificial film 56a. Only the sacrificial film 56b may be formed on the inner wall of the memory hole MHa, for example.

The sacrificial film 56b includes a metal having a high melting temperature (tungsten, tantalum, and the like), for example. Tungsten that has excellent embedability is used as the sacrificial film 56b, for example. Titanium nitride that has excellent adhesion properties with tungsten and silicon is used as the sacrificial film 56a, for example.

After that, the sacrificial films 56a and 56b that are formed on the cover layer 66 are removed by the CMP method, for example.

Figure 5C:
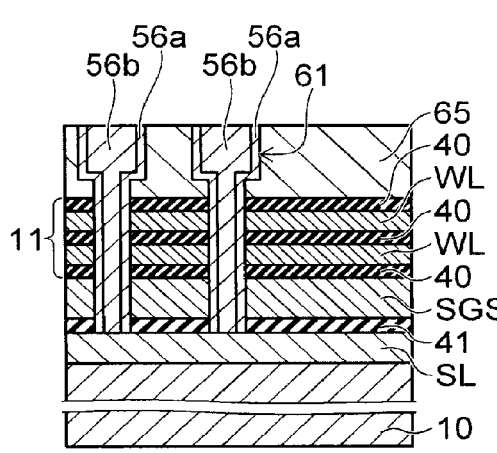

Next, as illustrated in FIG. 5C, upper portions of the sacrificial films 56a and 56b, and the cover layer 66 are removed. The CDE method is used as a method to remove the sacrificial films 56a and 56b, for example. The sacrificial films 56a and 56b are removed up to an upper surface of the dummy layer 65 by the CDE method.

After that, the cover layer 66 is removed. Isotropic etching using buffered hydrogen fluoride (BHF) is used as a method to remove the cover layer 66, for example. As a result, the upper surface of the dummy layer 65 is exposed in the same plane as upper surfaces of the sacrificial films 56a and 56b.

Figure 5D:
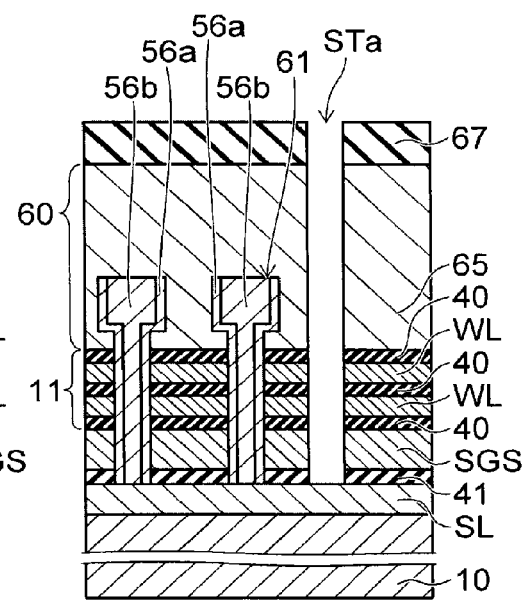

Next, as illustrated in FIG. 5D, the dummy layer 65 is further formed on the upper surface of the dummy layer 65 and the upper surfaces of the sacrificial films 56. As a result, the intermediate layer 60 is formed.

The upper surfaces of the sacrificial films 56a and 56b are covered by the dummy layer 65. A thickness of the additionally formed dummy layer 65 (a second intermediate layer) is 100 nm, for example. A cover layer 67 is formed on the intermediate layer 60.

As illustrated in FIG. 5D, a slit STa is formed that pierces a portion from the cover layer 67 to the insulating layer 41. The slit STa is formed by the RIE method using the mask that is not illustrated in the drawings, for example.

Figure 6A:
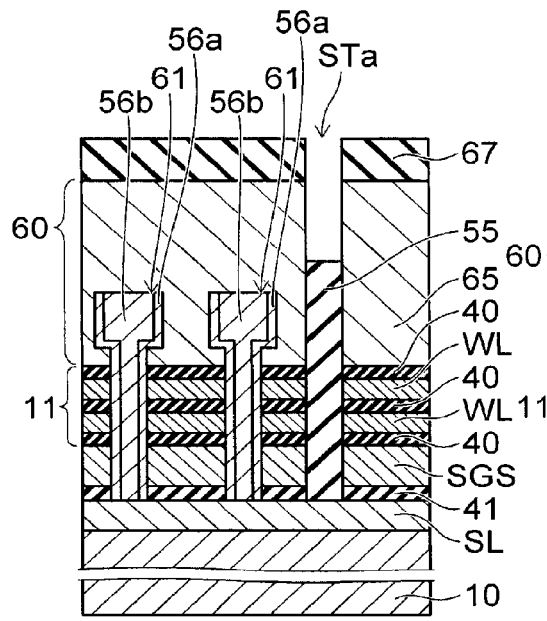

As illustrated in FIG. 6A, the resist film 55 is formed in the slit STa (a first slit). The resist film 55 is embedded from a lower end portion of the slit STa to a certain height in the intermediate layer 60. The resist film 55 embedded in the slit STa and the resist film 55 formed on the cover layer 67 are etched back and retreat to a certain height in the intermediate layer 60. The upper surface of the resist film 55 retreats to a height positioned between the upper surface of the first enlarged portion 61 and the upper surface of the intermediate layer 60, for example.

Next, etching is isotropically performed, through the slit STa, of the side surface of the dummy layer 65 that is formed above the upper surface of the resist film 55. The CDE method is used as a method to remove the dummy layer 65, for example.

After that, etching is isotropically performed of the side surface of the cover layer 67 through the slit STa. The isotropic etching using the buffered hydrogen fluoride (BHF) is used as a method to remove the cover layer 67, for example. By this, on a side wall of the slit STa, a side surface of the cover layer 67 is formed in the same plane as the side surface of the dummy layer 65.

Figure 6B:
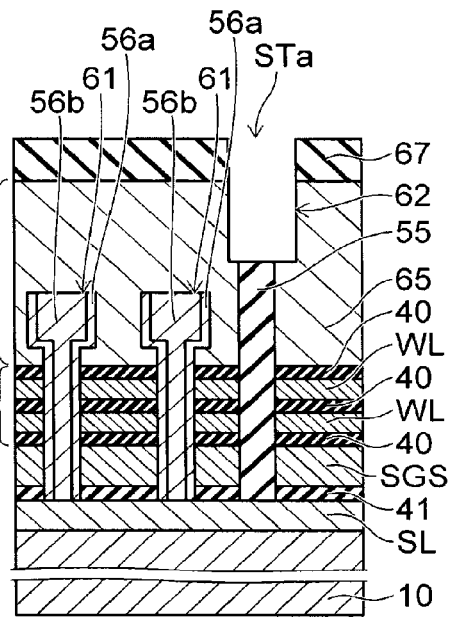

As a result, as illustrated in FIG. 6B, the second enlarged portion 62 is formed in the slit STa. A width of the second enlarged portion 62 is larger than a width of the slit STa that is formed below the second enlarged portion 62. The second enlarged portion 62 is surrounded respectively by the dummy layer 65 and the cover layer 67. The position of the second enlarged portion 62 in the stacking direction is separated further from the first stacked portion 11 than from the position of the first enlarged portion 61 in the stacking direction.

Next, the resist film 55 that remains in the slit STa is removed.

Figure 6C:
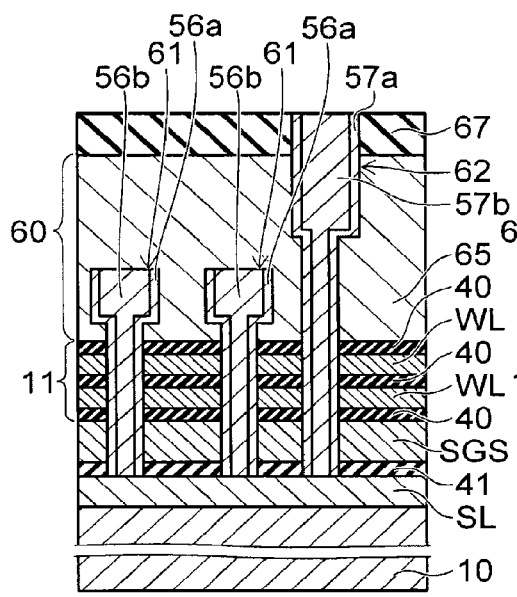

As illustrated in FIG. 6C, a sacrificial film 57a (a third film) is formed on an inner wall of the slit STa, and a sacrificial film 57b (a fourth film) is formed on an inner side of the sacrificial film 57a. Only the sacrificial film 57b may be formed on the inner wall of the slit STa, for example.

The sacrificial film 56b includes a metal having a high melting temperature (tungsten, tantalum, and the like), for example. For example, titanium nitride is used as the sacrificial film 57a, and tungsten is used as the sacrificial film 57b.

After that, the sacrificial films 57a and 57b formed on the cover layer 67 are removed by the CMP method, for example.

Figure 6D:
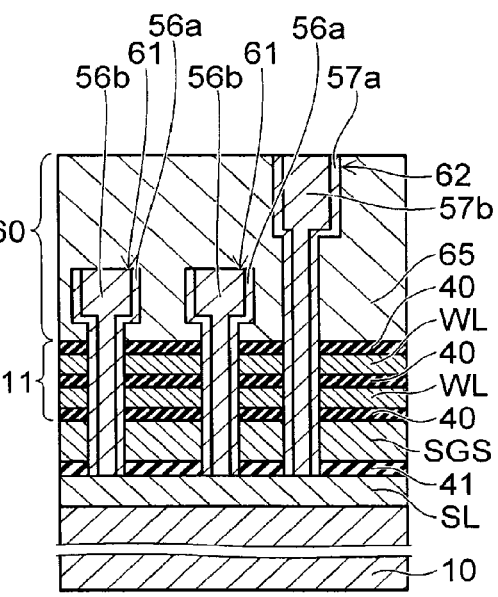

Next, as illustrated in FIG. 6D, upper portions of the sacrificial films 57a and 57b, and the cover layer 67 are removed. The CDE method is used as a method to remove the sacrificial films 57a and 57b, for example. The sacrificial films 57a and 57b are removed up to the upper surface of the dummy layer 65 by the CDE method.

After that, the cover layer 67 is removed. The isotropic etching using the buffered hydrogen fluoride (BHF) is used as a method to remove the cover layer 67, for example. As a result, the upper surface of the dummy layer 65 is exposed in the same plane as upper surfaces of the sacrificial films 57a and 57b.

Figures 7A, 7B:
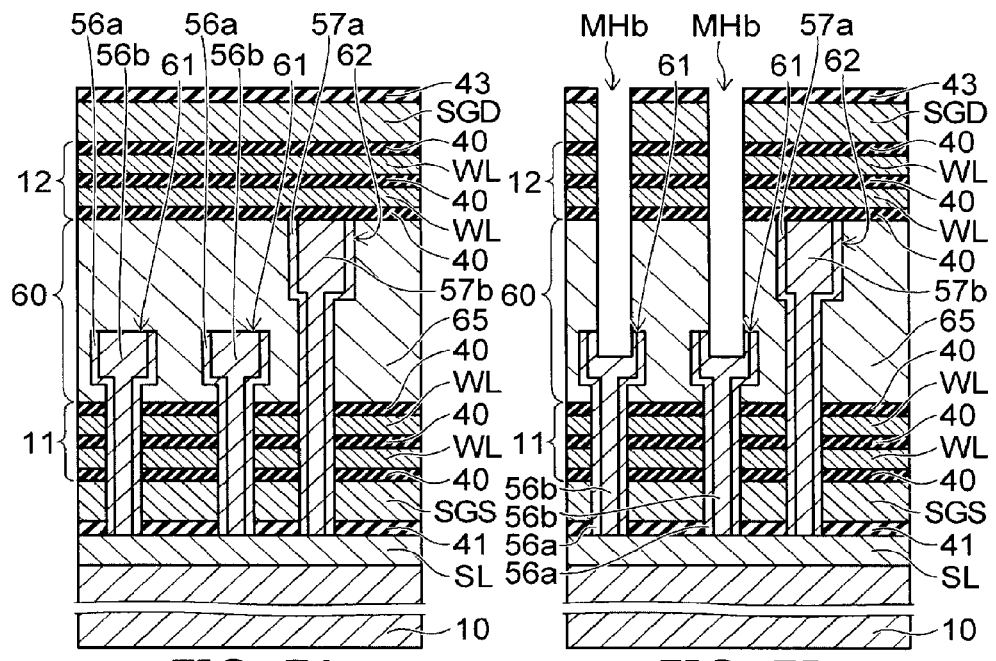

As illustrated in FIG. 7A, the second stacked portion 12 is formed on the intermediate layer 60 (on the dummy layer 65 and the sacrificial films 57a and 57b), the second stacked portion 12 includes the electrode layers WL and the insulating layers 40. The electrode layers WL are separately stacked each other, the insulating layers 40 are provided between the electrode layers WL. The insulating layers 40 and the electrode layer WL are, for example, alternately stacked on one another. The upper surfaces of the sacrificial films 57a and 57b are covered by the insulating layer 40. The insulating layer 40 of the second stacked portion 12 is formed on the second enlarged portion 62 and the sacrificial films 57a and 57b, and in contact with the sacrificial films 57a and 57b. The sacrificial film 57a and 57b are embedded in the intermediate layer 60.

On the second stacked portion 12, the drain-side select gate SGD is formed with the insulating layer 40 interposed therebetween.

As illustrated in FIG. 7B, the memory hole MHb (a second hole) is formed. The memory hole MHb is formed by the RIE method using the mask that is not illustrated in the drawings, for example.

The memory hole MHb pierces an insulating layer 43, the drain-side select gate SGD, and the second stacked portion 12 and reaches the first enlarged portion 61. The sacrificial films 56a and 56b are exposed on a bottom face of the memory hole MHb, the sacrificial film 56a and 56b are embedded in the first enlarged portion 61.

At this time, even when a central axis of the memory hole MHb is out of alignment with the central axis of the memory hole MHa formed in the first stacked portion 11, the memory hole MH can be integrally formed via the first enlarged portion 61. Specifically, the first enlarged portion 61 can be used as a stopper for the memory hole MHb that penetrates through the second stacked portion 12. By having the first enlarged portion 61 that has a larger diameter than a diameter of a portion piercing the first stacked portion 11, it is possible to reliably stop etching of the memory hole MHb.

After that, the sacrificial films 56a and 56b in the first enlarged portion 61 and the sacrificial films 56a and 56b formed below the first enlarged portion 61 are removed through the memory hole MHb. When removing the sacrificial films 56a and 56b, a mixed solution of $H_2SO_4$:$H_2O_2$=1:1 is used, for example.

As a result, as illustrated in FIG. 8A, the memory hole MH that penetrates through a portion from the first stacked portion 11 to the second stacked portion 12 is integrally formed.

After the sacrificial films 56a and 56b are removed, each of the films (the films including the memory film 30 and the channel body 20) illustrated in FIG. 3 is formed in sequence on an inner wall of the memory hole MH. After that, each of the films formed on the insulating layer 43 is removed. As a result, as illustrated in FIG. 8B, the columns CL are formed.

As illustrated in FIG. 9A, a slit STb (a second slit) is formed. The slit STb is formed by the RIE method using the mask that is not illustrated in the drawings, for example.

The slit STb pierces the insulating layer 43, the drain-side select gate SGD, and the second stacked portion 12 and reaches the second enlarged portion 62. The sacrificial films 57a and 57b are exposed on a bottom face of the slit STb.

At this time, even when a central axis of the slit STb is out of alignment with the central axis of the slit STa formed in the first stacked portion 11, the slit ST can be integrally formed via the second enlarged portion 62. Specifically, the second enlarged portion 62 can be used as a stopper for the slit STb that penetrates through the second stacked portion 12 and the intermediate layer 60. By having the second enlarged portion 62 that has a larger diameter than a diameter of the portion piercing the first stacked portion 11, it is possible to reliably stop etching of the slit STb.

After that, the sacrificial films 57a and 57b in the second enlarged portion 62 and the sacrificial films 57a and 57b formed below the second enlarged portion 62 are removed through the slit STb. When removing the sacrificial films 57a and 57b, a mixed solution of $H_2SO_4$: $H_2O_2$=1:1 is used, for example.

As a result, as illustrated in FIG. 9B, the slit ST that penetrates through the portion from the first stacked portion 11 to the second stacked portion 12 is integrally formed.

As illustrated in FIG. 10, metal silicide processing is performed on the silicon layers of the stacked body through the slit ST. By the metal silicide processing, metal silicide parts (WLs, SGDs, SGSs, 65s) are formed respectively on the electrode layers WL, the drain-side select gate SGD, the source-side select gate SGS, and the dummy layer 65, and the resistance is lowered.

As the metal silicide processing, a metal film is conformally formed on a side wall of the slit ST, and high temperature annealing is performed, for example. As a result, the silicon included in the electrode layers WL, the drain-side select gate SGD, the source-side select gate SGS, and the dummy layer 65 and the metal included in the metal film reacts. Then, the metal silicide parts are formed respectively on the electrode layer, the drain-side select gate SGD, the source-side select gate SGD, and the dummy layer 65, each of which is adjacent to the slit ST.

After unreacted excess metal is removed, as illustrated in FIG. 2A, the insulating film is embedded in the slit ST, and the insulating separation part 51 is formed. After the insulating separation part 51 is formed, a bit line BL, a source line, and the like are formed on the stacked body. As a result, the semiconductor memory device of this embodiment is obtained. A lead wiring may be provided on an inner side of the insulating film in the slit ST, the lead wiring is connected to the source layer SL and extends upward (in the Z-direction).

According to this embodiment, when the memory hole MH and the slit ST are formed in a divided manner using a plurality of stages, the intermediate layer and the enlarged portions are formed. As a result, even when the opening pattern of the resist mask happens to be misaligned, a hole or a slit formed at the time of processing upper layers does not reach the stacked portion formed below the upper layers, and it is thus possible to form the memory hole MH and the slit ST in an integrated manner. As a result, an improvement in the yield of the semiconductor memory device can be expected.

Further, a material that has a high etching selectivity ratio with respect to the stacked layer and the intermediate layer (tungsten, titanium nitride, and the like) is used for the sacrificial films 56a, 56b, 57a, and 57b. As a result, in a process of removing the sacrificial films 56a, 56b, 57a, and 57b from the memory hole MHa and the slit STa, it is possible to suppress degradation of the shapes and dimensions of the side surfaces of the memory hole MHa and the slit STa. It is thus possible to improve the yield of the semiconductor device.

Further, the position of the first enlarged portion 61 and the position of the second enlarged portion 62 are displaced with respect to each other in the stacking direction, and there is no section having a narrow width at which the first enlarged portion 61 and the second enlarged portion 62 face each other. Thus, when the metal silicide processing is performed on the intermediate layer 60, a sufficient area is secured for the metal silicide part 65s to be formed. Therefore, it is possible to cause a time constant of the intermediate layer 60 to be similar to a time constant of the electrode layer WL.

In addition to the description made above, the position of the first enlarged portion 61 is formed further to the first stacked portion 11 side than the position of the second enlarged portion 62. The upper surface of the second enlarged portion 62 is in contact with the insulating layer 40 of the second stacked portion 12. In this case, in a high temperature thermal process that is performed when the column CL is formed in the memory hole MH, the metal included in the sacrificial film 57b of the second enlarged portion 62 (tungsten, for example) does not react with the silicon layers of the second stacked portion 12, as illustrated in FIG. 8B. As a result, it becomes possible to improve the yield.

As described above, according to this embodiment, it is possible to form the memory hole MH and the slit ST in a divided manner using not less than 2 stages without enlarging the memory size. It is thus possible to form the hole and the slit having a low aspect ratio. As a result, excellent shape and dimensional controllability of the hole and the slit is achieved. Further, it is possible to suppress degradation of the time constant of the intermediate layer 60, which may be caused by the formation of the enlarged portions 61 and 62. As a result, it is possible to realize capacity enlargement, cost reduction, yield improvement, and speed improvement of the memory device.

Figure 11:
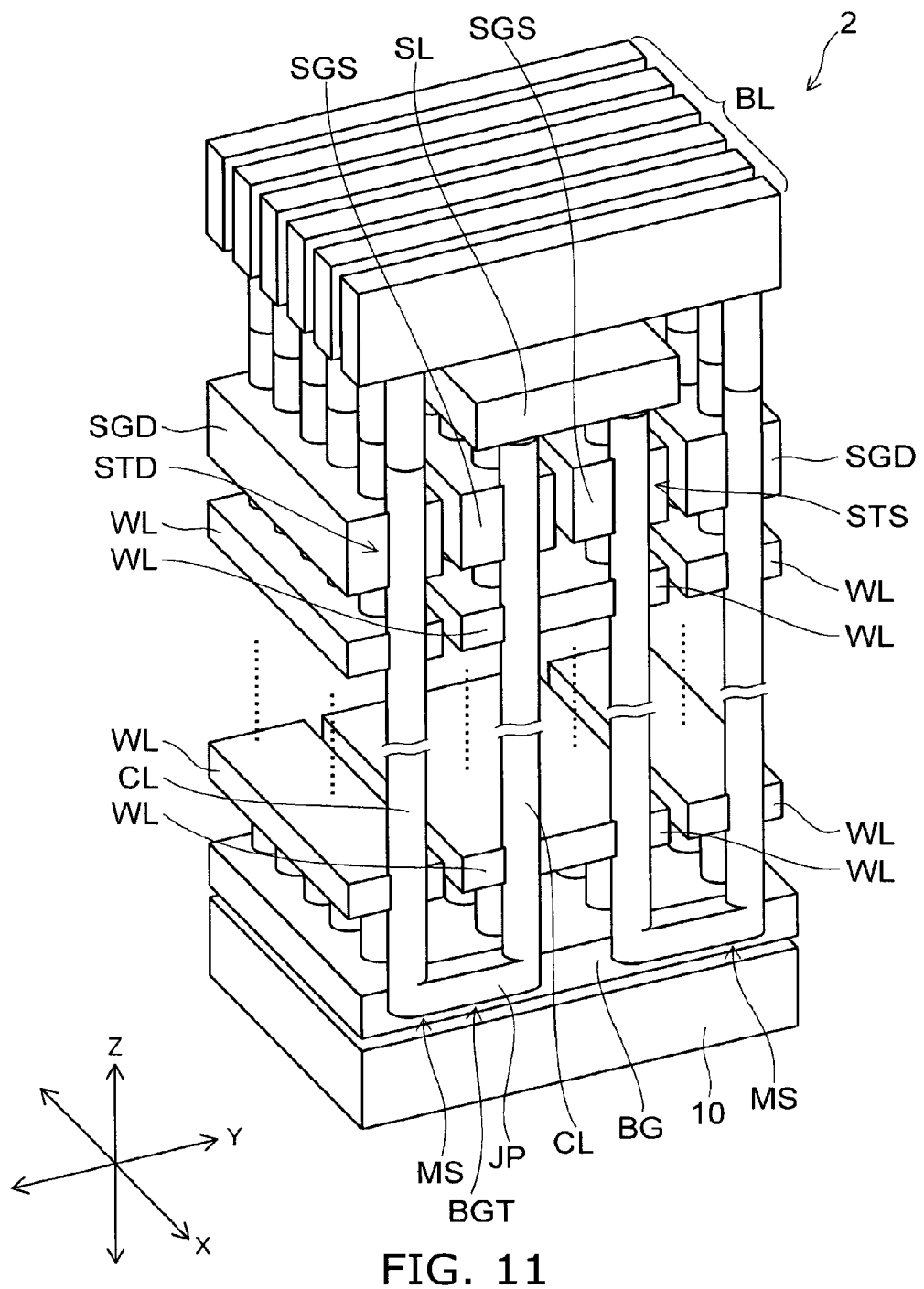
FIG. 11 is a schematic perspective view of a memory cell array of another example of the semiconductor memory device of the embodiment.

FIG. 11 is a schematic perspective view of a memory cell array 2 of another example of the semiconductor memory device of the embodiment. In FIG. 11, similarly to FIG. 1, the insulating layers, and the like are omitted for ease of understanding of the drawing.

A back gate BG is provided on the substrate 10 with an insulating layer interposed therebetween. On the back gate BG, a stacked body is provided in which the plurality of electrode layers WL and the plurality of insulating layers 40 are alternately stacked on one another.

A single memory string MS is formed in a U-shape and includes a pair of columns CL extending in the Z-direction, and a connecting portion JP that connects bottom ends of each of the pair of columns CL. The column CL is formed as a cylindrical pillar or an elliptical pillar shape, for example, and penetrates through the stacked body and reaches the back gate BG.

A drain-side select gate SGD is provided on an upper end portion of one of the pair of columns CL in the U-shaped memory string MS, and a source-side select gate SGS is provided on an upper end portion of the other. The drain-side select gate SGD and the source-side select gate SGS are provided above the uppermost electrode layer WL with the insulating layer 40 interposed therebetween.

The drain-side select gate SGD and the source-side select gate SGS are separated in the Y-direction by an insulating separation part. The stacked body below the drain-side select gate SGD and the stacked body below the source-side select gate SGS are separated in the Y-direction by the insulating separation part. In other words, the stacked body between the pair of columns CL of the memory string MS is separated in the Y-direction by the insulating separation part.

A source layer SL (a metal film, for example) is provided on the source-side select gate SGS with the insulating layer interposed therebetween. A plurality of bit lines (metal films, for example) is provided above the drain-side select gate SGD and above the source layer SL with an insulating layer interposed therebetween. Each of the bit lines BL extends in the Y-direction.

Similarly to the embodiment described above, in the memory cell array 2 illustrated in FIG. 11, the stacked body also has a plurality of stacked portions, and the intermediate layer 60, the first enlarged portion 61, and the second enlarged portion 62 are provided between the plurality of stacked portions. As a result, similarly to the embodiment described above, it is possible to achieve the capacity enlargement, cost reduction, yield improvement, and speed improvement of the memory device.

According to one embodiment, a semiconductor memory device includes: a substrate; a lower stacked body provided on the substrate; an upper stacked body provided on the lower stacked body; a first film provided between the lower stacked body and the upper stacked body; a memory hole including a first memory hole portion, a second memory hole portion and a connecting portion, the first memory hole portion provided in the upper stacked body, the second memory hole portion provided in the lower stacked body, the connecting portion integrally connected to the first memory hole portion and the second memory hole portion, the connecting portion provided in contact with the first film; a memory film provided in the memory hole; and a silicon cannel layer provided inside the memory film in the memory hole, and the first film is in contact with an upper surface of the connecting portion, a side surface of the connecting portion and a lower surface of the connecting portion.

According to one embodiment, the first film includes a conductive film.

According to one embodiment, the first film includes an insulating film.

According to one embodiment, the first film integrally covers the upper surface of the connecting portion, the side surface of the connecting portion and the lower surface of the connecting portion, and as viewed in the first direction parallel to a major surface of the substrate, the first film overlaps the connecting portion.

According to one embodiment, an upper side of the silicon cannel layer is electrically connected to a bit line, and a lower side of the silicon cannel layer is electrically connected to source layer.

According to one embodiment, an upper side of the silicon cannel layer is electrically connected to a bit line, the bit line extends in the first direction, and in the first direction, a length of the connecting portion is longer than a length of the first memory hole portion and longer than a length of the second memory hole portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
a substrate;
a lower stacked body provided on the substrate;
an upper stacked body provided on the lower stacked body;
a first film provided between the lower stacked body and the upper stacked body;
a memory portion including
a first memory portion provided in the upper stacked body,
a second memory portion provided in the lower stacked body, and
a connecting portion integrally connected to the first memory portion and the second memory portion, the connecting portion provided in contact with the first film;
a memory film provided in the memory portion; and
a channel layer provided inside the memory film in the memory portion, wherein
the first film is in contact with an upper surface of the connecting portion, a side surface of the connecting portion and a lower surface of the connecting portion.

2. The device according to claim 1, wherein the first film includes a conductive film.

3. The device according to claim 1, wherein the first film includes an insulating film.

4. The device according to claim 1, wherein
the first film integrally covers the upper surface of the connecting portion, the side surface of the connecting portion and the lower surface of the connecting portion, and
as viewed from a first direction parallel to a major surface of the substrate, the first film overlaps the connecting portion.

5. The device according to claim 1, wherein
an upper side of the channel layer is electrically connected to a bit line, and
a lower side of the channel layer is electrically connected to a source layer.

6. The device according to claim 1, wherein
an upper side of the channel layer is electrically connected to a bit line, the bit line extending in a first direction parallel to a major surface of the substrate, and
in the first direction, a length of the connecting portion is longer than a length of the first memory portion and longer than a length of the second memory portion.

7. The device according to claim 1, wherein, as viewed from a stacking direction from the lower stacked body to the upper stacked body, a central axis of the first memory portion is deviated from a central axis of the second memory portion.

8. The device according to claim 1, wherein the lower stacked body and the upper stacked body include a plurality of electrode layers and a plurality of insulating layers, the electrode layers separately stacked upon each other, the insulating layers provided between the electrode layers.

9. The device according to claim 8, wherein a memory film includes a charge storage film provided between the channel layer and at least one of the electrode layers.

10. The device according to claim 8, wherein a thickness of the first film is thicker than a thickness of the electrode layers.

11. The device according to claim 10, wherein the thickness of the first film is not less than three times thicker than the thickness of the electrode layers.

12. The device according to claim 8, wherein the first film includes a material being the same as a material of the electrode layers.

13. The device according to claim 8, wherein the first film includes a material being the same as a material of the insulating layers.

14. The device according to claim 8, wherein the electrode layers include silicon and have a metal silicide part.

15. The device according to claim 1, further comprising an insulating part including
a first insulating portion provided in the upper stacked body,
a second insulating portion provided in the lower stacked body, and
a connecting insulating portion integrally connected to the first insulating portion and the second insulating portion, the connecting insulating portion being in contact with the first film, wherein the first film is in contact with a side surface of the connecting insulating portion and a lower surface of the connecting insulating portion.

16. The device according to claim 15, wherein, in a stacking direction from the lower stacked body to the upper stacked body, a position of the connecting portion is deviated from a position of the connecting insulating portion.

17. The device according to claim 16, wherein, in the stacking direction, a height of the lower surface of the connecting insulating portion is higher than a height of the upper surface of the connecting portion.

18. The device according to claim 15, wherein an upper surface of the connecting insulating portion is in contact with a lower surface of the upper stacked body.

19. The device according to claim 15, wherein, as viewed from a stacking direction from the lower stacked body to the upper stacked body, a central axis of the first insulating portion is deviated from a central axis of the second insulating portion.

20. The device according to claim 15, wherein the insulating part extends in a first direction parallel to a major surface of the substrate.

* * * * *